United States Patent
Choi et al.

(10) Patent No.: US 11,249,405 B2
(45) Date of Patent: Feb. 15, 2022

(54) SYSTEM AND METHOD FOR IMPROVING THE PERFORMANCE OF A NANOIMPRINT SYSTEM

(71) Applicant: CANON KABUSHIKI KAISHA, Tokyo (JP)

(72) Inventors: Byung-Jin Choi, Austin, TX (US); Se-Hyuk Im, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 519 days.

(21) Appl. No.: 15/966,463

(22) Filed: Apr. 30, 2018

(65) Prior Publication Data

US 2019/0332021 A1 Oct. 31, 2019

(51) Int. Cl.
*G03F 9/00* (2006.01)
*G03F 7/00* (2006.01)
*B82Y 40/00* (2011.01)
*B29C 45/77* (2006.01)

(52) U.S. Cl.
CPC ............ *G03F 9/7042* (2013.01); *B29C 45/77* (2013.01); *G03F 7/0002* (2013.01); *B29C 2791/006* (2013.01); *B82Y 40/00* (2013.01)

(58) Field of Classification Search
CPC ... B29C 2791/006; B29C 45/77; B82Y 40/00; G03F 9/7042; G03F 7/0002; G03F 7/0017; G03F 7/0022; G03F 7/0027; G03F 7/12; G03F 7/115
USPC ........................................................ 264/293
See application file for complete search history.

(56) References Cited

U.S. PATENT DOCUMENTS

| | | | |
|---|---|---|---|
| 5,737,064 A * | 4/1998 | Inoue | G03F 7/7035 355/73 |
| 6,381,002 B1 * | 4/2002 | Suzuki | G03F 7/70691 355/53 |
| 6,936,194 B2 | 8/2005 | Watts | |
| 6,954,275 B2 * | 10/2005 | Choi | B29C 31/045 250/548 |
| 7,157,036 B2 | 1/2007 | Choi et al. | |
| 7,490,547 B2 * | 2/2009 | Van Santen | B41C 1/10 101/453 |
| 7,906,058 B2 * | 3/2011 | GanapathiSubramanian | B29C 43/003 264/313 |
| 8,066,930 B2 | 11/2011 | Sreenivasan et al. | |
| 8,076,386 B2 | 12/2011 | Xu et al. | |
| 8,261,660 B2 * | 9/2012 | Menard | H01L 24/74 101/32 |
| 8,349,241 B2 | 1/2013 | Sreenivasan et al. | |
| 8,968,620 B2 | 3/2015 | Im et al. | |

(Continued)

FOREIGN PATENT DOCUMENTS

WO WO-2017201602 A1 * 11/2017 ............. B32B 38/10

*Primary Examiner* — Francisco W Tschen
*Assistant Examiner* — Edgaredmanuel Troche
(74) *Attorney, Agent, or Firm* — Daniel Ratoff

(57) ABSTRACT

A system and method of imprinting a formable material on a substrate includes a feature with a template. The substrate is initially held with a first back pressure. After which the template is brought into contact with the formable material. A template strain tensor above the feature may be greater than a strain threshold. The substrate is then held with a second back pressure less than the first back pressure, after which the substrate strain below the feature increases. After which the formable material is solidified.

18 Claims, 5 Drawing Sheets

(56) References Cited

U.S. PATENT DOCUMENTS

| | | | | |
|---|---|---|---|---|
| 2004/0104641 | A1* | 6/2004 | Choi | G03F 7/0002 |
| | | | | 310/328 |
| 2006/0197036 | A1* | 9/2006 | Severijns | G03F 7/707 |
| | | | | 250/492.1 |
| 2011/0260361 | A1* | 10/2011 | Im | G03F 7/0002 |
| | | | | 264/293 |
| 2016/0039126 | A1* | 2/2016 | Tan | B29C 43/58 |
| | | | | 264/40.5 |
| 2018/0050483 | A1* | 2/2018 | Guan | B29C 59/02 |
| 2018/0079130 | A1* | 3/2018 | Okafuji | B29C 59/026 |
| 2018/0143530 | A1* | 5/2018 | Li | G03F 7/0002 |
| 2018/0157170 | A1* | 6/2018 | Singh | B29C 33/424 |
| 2020/0223206 | A1* | 7/2020 | Najiminaini | G03F 7/0002 |

\* cited by examiner

SYSTEM AND METHOD FOR IMPROVING THE PERFORMANCE OF A NANOIMPRINT SYSTEM

BACKGROUND

Field of Art

The present disclosure relates to systems and methods for controlling a nanoimprint system.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control, improving throughput, and/or improving yield while also allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating one or more layers of integrated devices. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the formation of a relief pattern in a formable material (polymerizable) layer and transferring a pattern corresponding to the relief pattern into and/or onto an underlying substrate. The patterning process uses a template spaced apart from the substrate and a formable liquid is applied between the template and the substrate. The formable liquid is solidified to form a solid layer that has a pattern conforming to a shape of the surface of the template that contacts the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, formable material removal, dicing, bonding, and packaging, and the like.

U.S. Pat. No. 8,968,620 discloses controlling the lateral strain in a template relative to the lateral strain of imprinted features on a substrate during separation of the templated from the imprinted features.

SUMMARY

A first embodiment, may be a method of imprinting a formable material on a substrate with a template. The substrate includes a feature. The method may include holding the substrate with a first back pressure. The method may include positioning the template and the substrate relative to each other such that the template is in contact with the formable material on the substrate. A first region of the template may be in contact with the formable material in the feature. Dimensions of the feature are such that a template strain tensor in the first region of the template may be greater than a strain threshold. The method may also include holding the substrate with a second back pressure. The second back pressure may be less than the first back pressure. A substrate strain below the feature after applying the second back pressure may be greater than the substrate strain below the feature before applying the second back pressure. The method may include starting to solidify the formable material.

In an aspect of the first embodiment, the dimensions of the feature may be a first feature width in a first direction that is greater than 1 mm and a second feature width in a second direction orthogonal to the first direction that is greater than 1 mm.

An aspect of the first embodiment, may further comprise dispensing the formable material as a plurality of droplets onto the substrate.

In an aspect of the first embodiment, a fluid spreading period may start after the substrate begins to be held with the first back pressure, after which the plurality of droplets start to merge and spread out. The fluid spreading period may end when all of the plurality of droplets have merged and forms a film that covers an imprinting region of the template.

In an aspect of the first embodiment, the substrate may begin to be held with the second back pressure during the fluid spreading period.

In an aspect of the first embodiment, the substrate may begin to be held with the second back pressure after the fluid spreading period.

In an aspect of the first embodiment, an absolute value of a difference between the template strain in the first region and the substrate strain below the feature may be less than a strain difference threshold beginning at a strain matched time that begins after the substrate begins to be held with the second back pressure and the strain matched time begins prior to the beginning of the starting to solidify the formable material.

In an aspect of the first embodiment, the template may have a pattern.

In an aspect of the first embodiment, the second back pressure may continue to be applied after beginning of the starting to solidify the formable material.

In an aspect of the first embodiment, a zone based vacuum chuck may be configured to hold the substrate.

An aspect of the first embodiment, may further include receiving substrate information. The substrate information may include information that is representative of a size and a location of the feature. The method may also include determining the second back pressure based on the substrate information.

In an aspect of the first embodiment, the feature may have a first feature width in a first direction that is greater than a first dimensional threshold and a second feature width in a second direction orthogonal to the first direction that is greater than the first dimensional threshold. The substrate may further include a second feature. The second feature may have a small feature width that is less than the first dimensional threshold. A second template strain that the template experiences in a second region of the template that is in contact with the formable material in the second feature may be below the strain threshold.

An aspect of the first embodiment, may further comprise receiving overlay data measurements based on previous imprinting steps. The previous imprinting steps may have used a variety of second back pressures. The method may further comprise setting the second back pressure based on the variety second back pressures so as to minimize a predicted overlay data measurement based on the received overlay data measurements.

An aspect of the first embodiment, may further comprise separating the template from the formable material that has solidified on the substrate after the starting to solidify the formable material. The method may further comprise starting to hold the substrate with a third back pressure greater than the second back pressure after the starting to solidify the formable material and prior to a starting of the separating the template from the formable material. A difference between the template strain tensor and a substrate strain tensor after the starting of the separating of the template from the formable material may be reduced by adjusting the third back pressure to be greater than the second back pressure.

In an aspect of the first embodiment, the template strain tensor in the first region of the template may be greater than the strain threshold during a subset of time, while the substrate is held with the first back pressure.

In an aspect of the first embodiment, in a first case in which the template has template features above the feature may have a lower second back pressure than a second case in which the template does not have template features above the feature.

A second embodiment, may be a method of manufacturing an article imprinting a formable material on a substrate with a template. The substrate may include a feature. The method may comprise holding the substrate with a first back pressure. The method may comprise positioning the template and the substrate relative to each other such that the template is in contact with the formable material on the substrate. A first region of the template may be in contact with the formable material in the feature. The dimensions of the feature are such that a template strain tensor in the first region of the template may be greater than a strain threshold, when the substrate remains subjected to the first back pressure. The method may further include holding the substrate with a second back pressure. The second back pressure may be less than the first back pressure. A substrate strain below the feature after applying the second back pressure may be greater than the substrate strain below the feature before applying the second back pressure. The method may further include starting to solidify the formable material. The method may further include separating the template from the solidified formable material. The method may further include processing the substrate, to manufacture the article.

A third embodiment, may be an imprinting system configured to imprint a formable material on a substrate with a template, the substrate including a feature. The system may include a substrate chuck configured to hold the substrate with a first back pressure. The system may include a positioning stage configured to position the template and the substrate relative to each other such that the template is in contact with the formable material on the substrate. A first region of the template may be in contact with the formable material in the feature. Dimensions of the feature are such that a template strain tensor in the first region of the template may be greater than a strain threshold, when the substrate remains subjected to the first back pressure. The substrate chuck may be configured to hold the substrate with a second back pressure. The second back pressure may be less than the first back pressure. A substrate strain below the feature after applying the second back pressure may greater than the substrate strain below the feature before applying the second back pressure. The system may include a curing system configured to start solidifying the formable material.

In an aspect of the third embodiment, the substrate chuck is a zone based vacuum chuck that is configured to apply the second back pressure to a first zone below the feature while also maintaining the first back pressure in a second zone that is not below the feature.

In an aspect of the third embodiment, the curing system includes an actinic radiation source and the curing system includes one or more optical components for guiding the actinic radiation though the template and into the formable material.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1A:
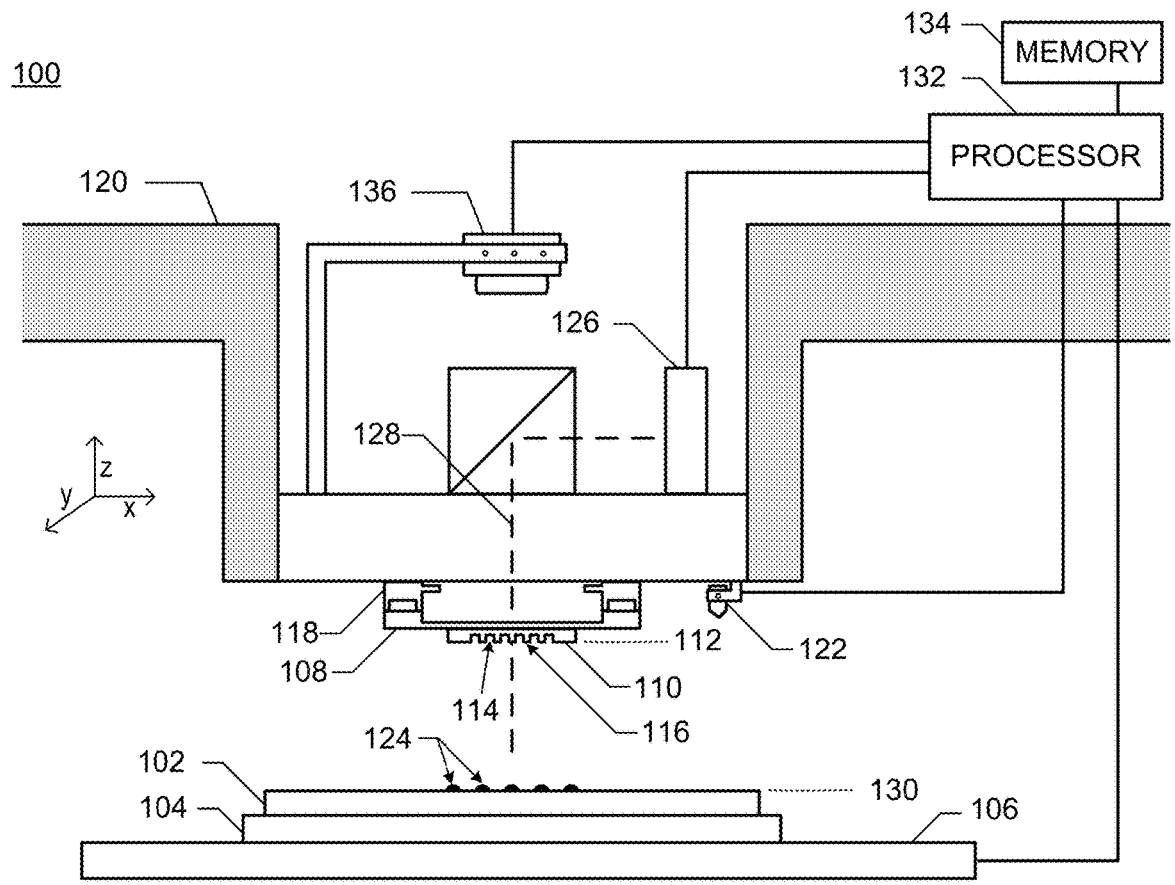
FIG. 1A is an illustration of a nanoimprint lithography system having a template and a mold spaced apart from a substrate which may be used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

One of the challenges for producing multilayer devices such as semiconductor devices is accurate overlay between two more layers or patterns. Multilayer devices contain multiple permanent and temporary layers (metallization, insulating, semiconducting, p-doped, n-doped, passivation, diffusion barrier, resist, etc.). Each of these multiple layers includes a pattern which are formed using a variety of techniques which may include nanoimprint lithography and/or optical lithography. Temporary patterns may be removed in subsequent processing steps. If the overlay error between these multiple layers is too high then the process will have low yields.

What is needed are systems and/or methods for reducing the overlay error associated with two overlapping features.

Nanoimprint System

FIG. 1A is an illustration of a nanoimprint lithography system 100 in which an embodiment may be implemented. The nanoimprint lithography system 100 is used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like. The substrate chuck 104 may be a zone based chuck that allows the pressure, force, and/or back pressure applied to the substrate 102 to vary across the substrate 102. The substrate chuck 104 may apply a negative pressure (back pressure) to the back of the substrate 102 in which case, the substrate 102 is pulled down against the substrate chuck 104. The substrate chuck 104 may also vary how much negative pressure is applied to different areas of the substrate 102. The substrate chuck 104 may apply both positive pressure and negative pressure to the back of the substrate 102. The substrate chuck 104 may also apply a downward pressure to the edges of the substrate 102 while also applying an upward pressure to one on or more portions of an inner part of the substrate 102.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown).

Spaced-apart from the substrate 102 is a template 108. The template 108 may include a body having a mesa (also referred to as a mold) 110 extending towards the substrate 102. The mesa 110 may have a patterning surface 112 thereon. Alternatively, the template 108 may be formed without the mesa 110, in which case the surface of the template facing the substrate 102 is equivalent to the mold 110 and the patterning surface 112 is that surface of the template 108 facing the substrate 102.

Figure 1B:
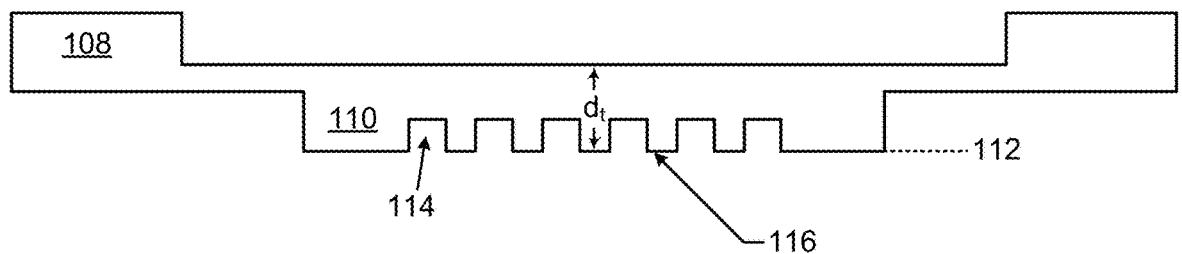
FIG. 1B is an illustration of a template which may be used in an embodiment.

The template 108 and/or the mold 110, illustrated in FIG. 1B, may be formed from such materials including, but not limited to, fused-silica, quartz, silicon, organic polymers, siloxane polymers, borosilicate glass, fluorocarbon polymers, metal, hardened sapphire, and/or the like. The patterning surface 112 comprises features defined by a plurality of spaced-apart template recesses 114 and/or template protrusions 116, though embodiments of the present invention are not limited to such configurations (e.g., planar surface). The patterning surface 112 defines a pattern that forms the basis of a pattern to be formed on the substrate 102. In an alternative embodiment, the patterning surface 112 is featureless in which case a planar surface is formed on the substrate. The template thickness $d_t$ may be measured from a template protrusion 116 to a back surface of the mesa 110. The back surface of the mesa 110 may be thinner than the body of the template 108 to improve the ability of the shape of mesa 110 to be adjusted during initial contact of the mesa 110 with the droplets 124.

Template 108 may be coupled to a template chuck 118. The template chuck 118 may be, but is not limited to, vacuum, pin-type, groove-type, electrostatic, electromagnetic, and/or other similar chuck types. The template chuck 118 may be configured to apply stress, pressure, and/or strain to template 108 that varies across the template 108. The template chuck 118 may be coupled to an imprint head which in turn may be moveably coupled to a bridge 120 such that the template chuck 118, the imprint head, and the template 108 are moveable in at least the z-axis direction, and potentially other directions (e.g. x, y, θ, and φ-axes).

Nanoimprint lithography system 100 may further comprise a fluid dispensing system 122. The fluid dispensing system 122 may be used to deposit formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensing systems 122 may use different technologies to dispense formable material 124. When the formable material 124 is jettable, ink jet type dispensers may be used to dispense the formable material. For example, thermal ink jetting, microelectromechanical systems (MEMS) based ink jetting, and piezoelectric ink jetting are common techniques for dispensing jettable liquids.

The nanoimprint lithography system 100 may further comprise an energy source 126 as part of a curing system that directs actinic energy along an exposure path 128. The Imprint head and the substrate positioning stage 106 may be configured to position the template 108 and the substrate 102 in superimposition with the exposure path 128. A camera 136 may likewise be positioned such that an imaging field of the camera 128 is in superimposition with the exposure path 128.

The nanoimprint lithography system 100 may be regulated, controlled and/or directed by one or more processors 132 (controller) in communication with one or more components and/or subsystems such as the substrate positioning stage 106, the imprint head, the fluid dispensing system 122, the source 126, and/or the camera 136 and may operate based on instructions in a computer readable program stored in a non-transitory computer readable memory 134. The processor 132 may be or include one or more of a CPU, MPU, GPU, ASIC, FPGA, DSP, and a general purpose computer. The processor 132 may be a purpose built controller or may be a general purpose computing device that is adapted to be a controller. Examples of a non-transitory computer readable memory includes but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head, the substrate positioning stage 106, or both varies a distance between the mold 110 and the substrate 102 to define a desired volume that is filled by the formable material 124. For example, the imprint head may apply a force to the template 108 such that mold 110 is in contact with the formable material 124. After the desired volume is filled with the formable material 124, the source 126 produces energy, e.g., actinic radiation (UV), causing formable material 124 to solidify and/or cross-link conforming to a shape of the substrate surface 130 and the patterning surface 112, defining a patterned layer on the substrate 102. Thus the nanoimprint lithography system 100 uses an imprinting process to form the patterned layer which has recesses and protrusions which are an inverse of the pattern in the patterning surface 112. This imprinting process may be done repeatedly in a plurality of imprinting fields that are spread across the substrate surface 130. Each of the imprinting fields may be the same size as the mesa 110 or just the pattern area of the mesa 110. In an alternative embodiment, the substrate 102 has only one imprint field which is the same size as the substrate 102 or the area of the substrate 102 which is to be patterned with the mesa 110. A curing system is a system which supplies energy to the formable material while the mold 110 is in contact with formable material causing the formable material to change phase from a liquid material into a material that can maintain the shape of the patterning surface 112 after the mold 110 is no longer in contact with the formable material 124.

The patterned layer may be formed such that it has a residual layer having a top layer residual layer thickness (RLT) $d_{rlt}$ above a highest point on the substrate surface 130 in each imprint field. The patterned layer may also include one or more features such as protrusions which extend above the residual layer having a thickness $d_{protrusion}$. These protrusion match the recesses 114 in the mesa 110.

Imprinting Method

Figure 2A:
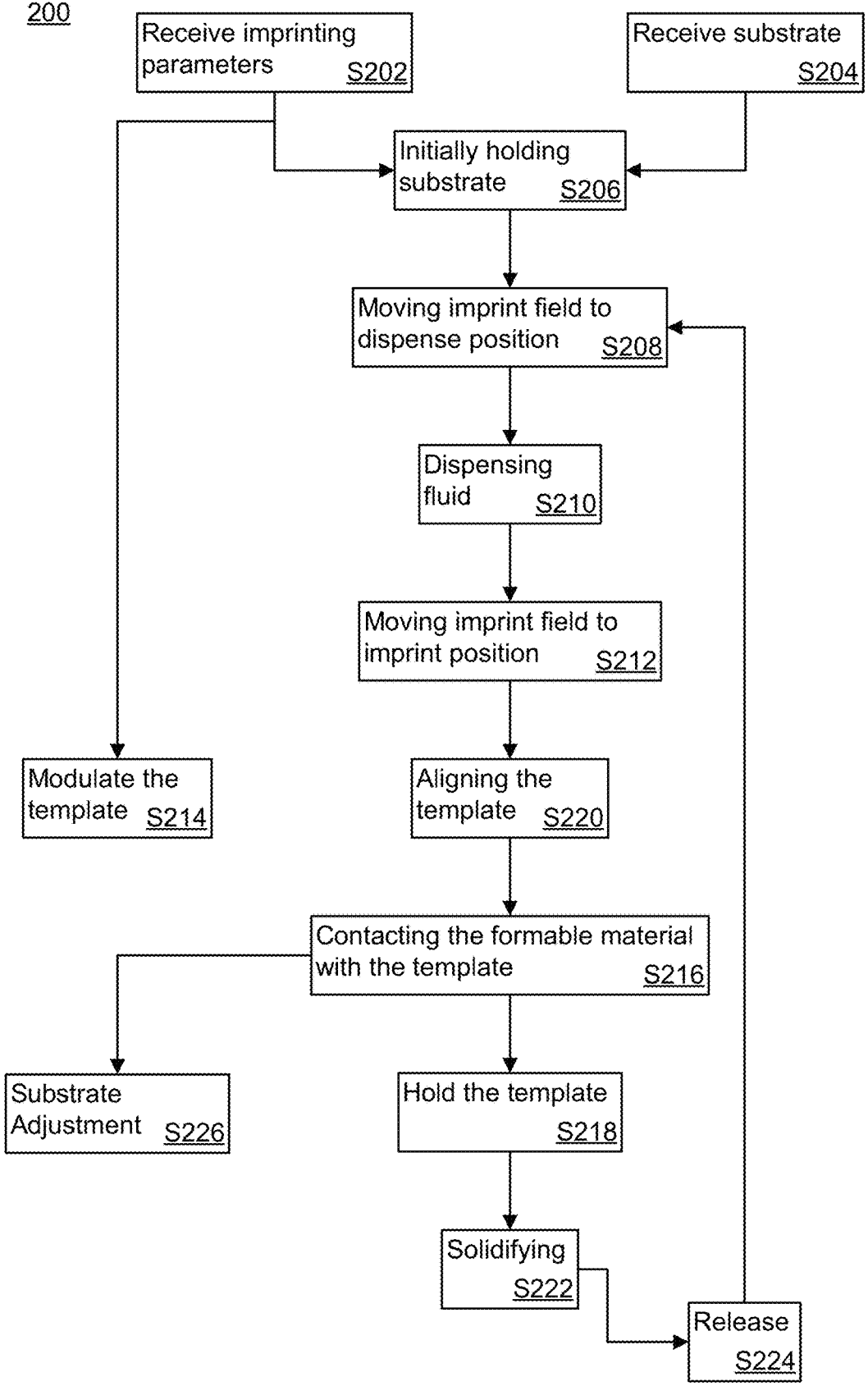
FIG. 2A is a flowchart illustrating steps of an imprinting method according to an embodiment.
Figure 2B:
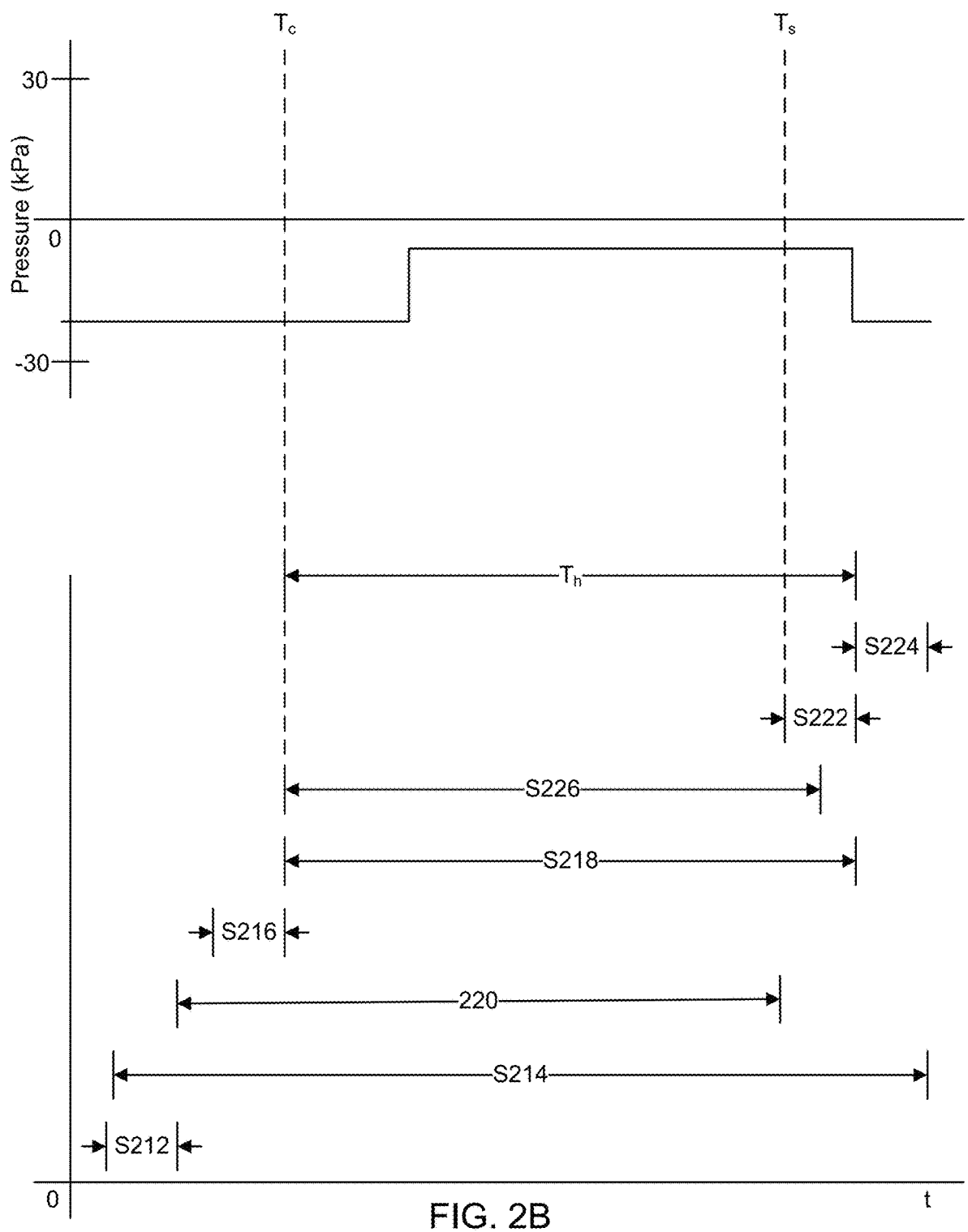
FIG. 2B is a timing diagram illustrating steps of an imprinting method according to an embodiment.

An imprinting method 200 illustrated in FIG. 2A may include an information receiving step S202 of the processor 132 receiving imprinting parameters. FIG. 2B is an illustration of process steps in method 200 and the timing of those steps in method 200 and how the back pressure may be adjusted during these steps. The back pressure is an attachment force per unit area that is used to keep the substrate 102 attached to the substrate chuck 104 and to substantially flatten any inherent curvature in the substrate 102. In an alternative embodiment, the attachment force may be supplied by the substrate chuck 104 via one or more of: vacuum, tabs, pins, grooves, electrostatic, electromagnetic or another force which can adjustably hold the substrate 102 to the substrate chuck. The imprinting parameters may include but are not limited to: pressures; timings; patterns; etc. The back pressure modulates the shape of the substrate 102. By modulating the shape of the substrate 102, the imprint force that is applied between the mesa 110 and the substrate 102 is also modulated. The starting time, spatial distribution, and duration of the back pressure can be used to modify the force, directions, and/or trajectories of the imprint force as distributed across the mesa 110. The processor 132 will receive the imprinting parameters, store them in memory 134, and adjust the imprinting process such that it is tailored to the pattern being generated by the template 108. The imprinting process may also be tailored to the specifics of the substrate 102 on which the pattern is being applied. For example, the substrate 102 may include specific features (e.g., large features) which require a variation in the imprinting process in accordance with an embodiment.

The imprinting method 200 may also include a substrate receiving step S204. The imprinting system 100 may include or be in communication with one or more substrate handling robots which implement step S204 by transferring one or more substrates 102 from substrate storage (e.g. a wafer carrier or a wafer cassette) to the substrate chuck 104.

The imprinting method 200 may also include an initial substrate holding step S206. The substrate chuck 104 may initially hold the substrate 102 using one or more of a variety of techniques including but not limited to vacuum pressure, front facing clamps, pins, and tabs. In one embodiment, the substrate chuck 104 is a vacuum chuck and supplies an initial negative back pressure $P_i$ (i.e. −20 kPa or −30 kPa) which is sufficient to prevent the substrate moving relative to the substrate chuck 104 in response to forces applied to the substrate 102.

The imprinting method 200 may also include moving the substrate chuck in a step S208 so that an imprint field is positioned under the fluid dispensing system 122. The substrate 102 may be divided into a grid that includes a plurality of imprinting fields. In an embodiment, the substrate positioning stage 106 may move the substrate chuck 104 into proper dispensing position. The substrate chuck 104 should hold the substrate 102 with enough initial back pressure that the substrate 102 is resistant to moving relative to the substrate chuck 104 while being moved by substrate positioning stage 106.

The imprinting method 200 may also include a dispensing step S210 of dispensing formable material 124 onto an imprint field. The formable material 124 may be jetted onto the substrate 102. The substrate chuck 104 should hold the substrate 102 with enough force that the substrate 102 is resistant to moving relative to the substrate chuck 104 when being impacted by formable material 124 dispensed by the fluid dispensing system.

The imprinting method 200 may also include moving the substrate chuck 104 in step S212 so that an imprint field is positioned under the patterning surface 122. In an embodiment, the substrate positioning stage 106 may move the substrate chuck 104 into proper imprinting position.

The imprinting method 200 may include a template modulating step S214 in which the template chuck 118 modulates the shape of the template 108. In an embodiment, the shape of the template is modulated by varying the pressure applied to different parts of the template 108. For example, the central portion of the patterning surface 122 may be pushed towards the substrate surface 130 relative to the rest of the patterning surface by applying positive pressure to the center of the template 108 while applying negative pressure to the edges of the template 108.

The imprinting method 200 includes a contacting step S216 in which the patterning surface 122 contacts the formable material 124 at an initial contact time $T_c$. In an embodiment, the moving step S212 includes moving the template chuck 118 down so that patterning surface 122 approaches the substrate surface 130 in an imprinting field with formable material 124 deposited upon it.

The imprinting method 200 includes a template holding step S218 in which the template 108 is held in contact with the formable material 124 for a holding period $T_h$. The formable material 124 will spread due to capillary pressure. During the holding period $T_h$ the modulation of the template may be adjusted to improve the filling of recesses 114 in the template 108, the dissipation of insoluble gas out of the imprint field, and/or improving overlay.

The imprinting method 200 may include an alignment step S220 in which the patterning area 112 of the template 108 is aligned with an imprint field on the substrate 102. The alignment step S220 may make use of alignment marks on the substrate 102 and the template 108. The alignment step may include one or both of moving the template chuck 118 with the bridge 120 and moving the substrate 102 with the substrate positioning stage 106.

The imprinting method 200 includes a solidifying step S222 wherein the formable material 124 is cured or gelled is started at a solidifying time $T_s$. Methods of solidifying the formable material 124 includes but are not limited to one or more applying heat, applying pressure, exposure to light, and exposure to chemicals. Solidifying, in the present context means that the solidified formable material substantially maintains it shape at least until the next processing step. In an embodiment, the formable material 124 is solidified by exposing the formable material 124 to actinic radiation from the energy source 126 along the path 128 through the template 108. The end of the solidifying step S222 may mark the end of the holding period $T_h$. The solidifying time $T_s$ may occur at a set period after the initial contact time $T_c$ by which time the template 108 has been aligned and any defect causing gas has been substantially purged out of the imprint field, such that defects are below a threshold.

The imprinting method 200 includes a template release step S224 wherein the template 108 is separated from the solidified formable material. In an embodiment, one or more motors may be used to raise the template 108 away from the solidified formable material. The template 108 may be modulated during the release step S224 so as to minimize damage to one or both of the template 108 and the solidified formable material. After the release step S224, the process starts over again until all the imprint fields on the substrate are imprinted.

In an embodiment, the imprinting method 200 also includes a substrate adjustment step S226. During the substrate adjustment step S226, the substrate is adjusted in a manner that improves the imprinting process. For example, the substrate adjustment step S226 may include having the substrate chuck 104 reducing the vacuum back pressure applied to the substrate after $T_c$ and the increasing the back pressure after the solidifying step S222 and prior to the release step S224. During the substrate adjustment step the back pressure applied to the substrate 102 or to just a portion of the substrate 102 is reduced. In an embodiment, reducing the back pressure means reducing the amount of force that is used to pull down the substrate. For example, the initial back pressure may be −30 kPa, which is than reduced to −20 kPa during the substrate adjustment step S226. In an alternative embodiment, reducing the back pressure on the substrate 102 may include applying positive upward pressure (i.e. via a pin or air) to a portion of the substrate. During the substrate adjustment step, the strain on the substrate increases relative to the strain prior to the substrate adjustment step. As the formable fluid film becomes thinner, the substrate and the template start to pull towards each other together. When the initial back pressure on the substrate is high enough the substrate is prevented from being pulled up towards the template and only the template is strained. As the substrate back pressure is reduced, the substrate strain increases and as a byproduct the template becomes less strained relative to when the substrate has a higher back pressure.

Overlay

Overlay in the context of the present disclosure refers to superposition of a template pattern with the substrate pattern. The template pattern is the patterning surface 112 in the template 108 currently being used for an imprinting process. While the substrate pattern is a topmost pattern that has already been formed on/and or in the substrate 102. Overlay tolerance in the context of the present disclosure refers to a target accuracy with which the patterning surface 112 is aligned with a pattern in the topmost surface of the substrate. Overlay error (pattern placement error) in the context of the present disclosure refers to a difference between the position of patterning surface 112 and the optimal position of the patterning surface 112 relative to a topmost pattern on the substrate 102. The overlay error may also refer to a final error after the formable material 124 has been cured (solidified). The measured overlay error in the context of the present disclosure may refer to a measured difference in overlay marks on the template 108 and overlay marks on the substrate 102. The measured overlay error may take the form of a map that varies across the substrate 102.

Figure 3A:
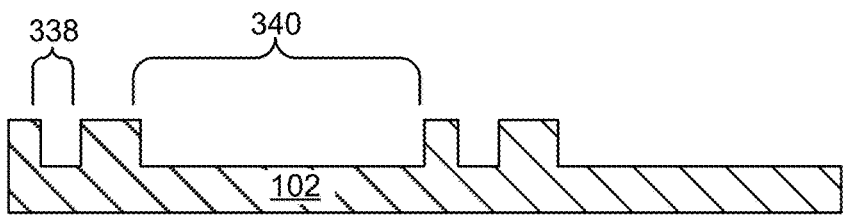
FIGS. 3A-3B are illustrations of a template that may be imprinted in an embodiment.

In an exemplary embodiment, the substrate surface 130 contains non-flat topography such as small features 338 and/or large features 340 as illustrated in FIG. 3A. Small features 338 are dips in the substrate surface 130 that are narrow in a top down view in at least one direction relative to the thickness of the template 118 from the front of the pattern on the mesa 110 to the back surface of the template above the mesa 110. Large features 340 are dips in the substrate surface 130 in which the narrowest dimension in the plane of the substrate 103 are greater than a dimensional threshold. In an embodiment, the dimensional threshold ($w_T$) is 1 mm. In an alternative embodiment, the dimensional threshold is a first multiple of the thickness the template 118 from the front of the pattern on the mesa 110 to the back surface of the template above the mesa 110. In an embodiment, the first multiple is 0.9 or 1.1. The applicant has found that for nanoimprint lithography, under certain circumstances, overlay error increases when the substrate surface 130 includes one or more large features 340. In an exemplary embodiment the overlay error increases in regions above the large feature 340. In an exemplary embodiment, fluid thickness variation in and around the large features 340 has an impact on overlay errors. In an alternative embodiment, a planar extent in a plane of the substrate of a feature has two or more dimensions, the narrowest of the two or more dimensions is a relevant dimension of the feature 340. When the relevant dimension is greater than a dimensional threshold than the feature is defined as a large feature. In an embodiment, dimensions of the large feature 340 are such that a template strain tensor in a region of the template above the large feature 340 is greater than a strain threshold, when the substrate remains subjected to a back pressure that keep the substrate substantially flat.

Figure 3B:
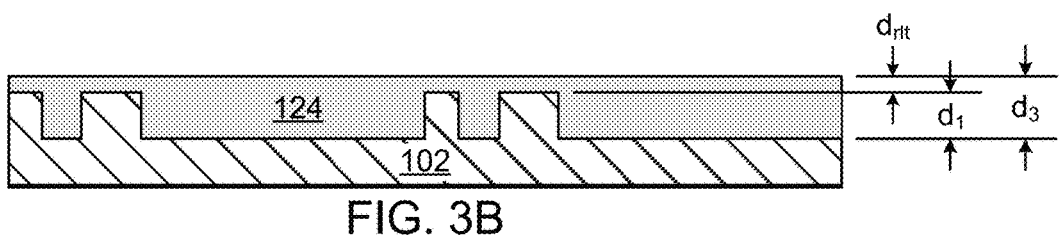

Prior to curing the formable material 124 may spread across the substrate 102. For example as illustrated in an exemplary embodiment in FIG. 3B the substrate 102 may have small features and large features with a uniform thickness $d_1$. In an alternative embodiment, the thickness of small features and large features on the substrate may have a non-uniform thickness that varies from 10 nm to 100 nm to several microns. Formable material 124 may spread across the substrate 102 filling in the small features and the large feature(s). The formable material 124 forms a fluid layer that has a top layer RLT $d_{rlt}$ and a total formable layer thickness $d_3$. In an exemplary embodiment, depth $d_1$ is 50 nm; depth $d_{rlt}$ is 20 nm; and depth $d_3$ is 70 nm. Capillary forces may be used to drive the spread of the formable material 124. The capillary force acting on the formable material 124 is a consequence of the patterning surface 112 being brought into contact with the formable material 124 on the substrate surface 130. The top layer RLT $d_{rlt}$ is a function of the distance between the patterning surface 112 and the substrate surface 130.

Figure 4A:
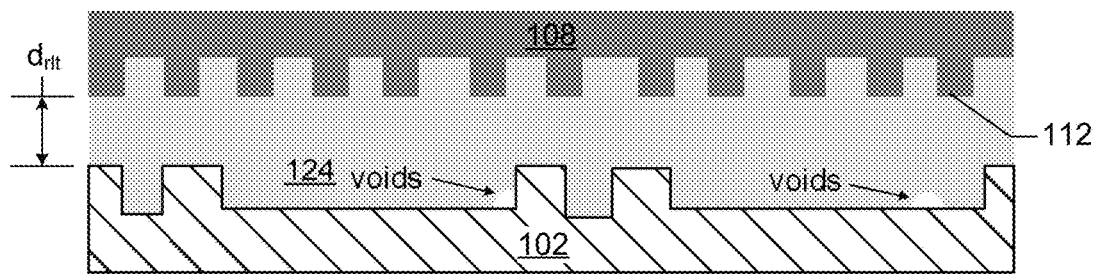
FIGS. 4A-4C are illustrations of a template being imprinted in an embodiment.

The applicant has found that as the top layer RLT $d_{rlt}$ decreases the speed with which the formable material spreads increases. The applicant has also found that as the top layer RLT $d_{rlt}$ decreases the overlay error increases. The overlay error tends to have the greatest increase under these circumstances in and around large features 340. FIG. 4A illustrates a situation in which the top layer RLT $d_{rlt}$ is large and the template 108 stays flat. FIG. 4A also illustrates a situation in which there are voids in the formable material 14 which are filled with gas.

Figure 4B:
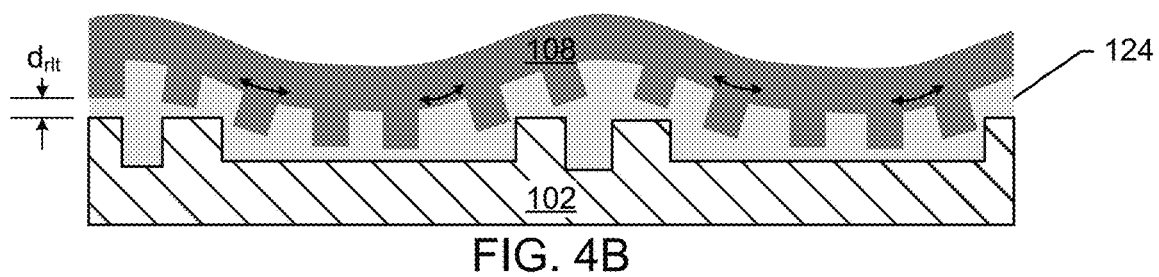

The applicant has determined that in general two plate like objects (e.g. template 108 and substrate 102), under some circumstances, conform to each other in the presence of a fluid between those two plates as illustrated in FIG. 4B. While, under other circumstances, the fluid layer may be adjusted within the small features 338 and/or large features 340 such that the patterning surface 112 remains relatively flat as illustrated in FIG. 4A. Having a thick top layer RLT $d_{rlt}$ may eliminate local strain on the template 108 as shown in FIG. 4A. However, having a thick top layer RLT $d_{rlt}$ also slows down the rate at which the formable material fills the gap between the substrate 102 and the template 108 due to capillary forces. As the distance between two plates increases, the velocity of the fluid front between the two plates decreases due to reduction in the capillary pressure which slows down the fill rate and reduces throughput.

When the top layer RLT $d_{rlt}$ is small and the formable material layer is uniform in both dense feature regions and the large feature regions the velocity of the fluid front is higher, the fill rate is faster which increases the throughput, but this can also cause strain in a corresponding region of the patterning surface in and around the large feature regions as illustrated in FIG. 4B. The strain shows up as a deformation of the patterning surface as the template 108 is pulled into the large feature regions. The patterning surface in the corresponding region will deform and stretch to conform to the large feature increasing the overlay error. The amount of strain in the pattern may be proportional to a template thickness $d_t$ above the large feature region. The amount of strain on the template in the corresponding region above the large feature region may also be a function of the distance between the bottom of the large feature region and a back surface of the template above the large feature region, when the formable material is in the large feature region. The material properties (i.e. density, viscosity, contact angle, wetting angle, capillary number, and/or surface tension) of the formable material may also have an impact on the amount of strain on the template above the large feature region. The amount of strain may be represented as a template strain tensor whose elements vary across the patterning area. The applicants have found that the variation in the amount of the elements in the template strain tensor is dependent upon the local substrate topography and the template thickness $d_t$. The template strain tensor may be considered greater than a strain threshold when, one or more elements of the template strain in the corresponding region of the template is greater than a strain threshold. One or both of the strain threshold and the template strain may be a constant or a tensor. The template strain tensor may be considered greater than the strain threshold when one or more elements of the template strain tensor in the corresponding region are greater than corresponding elements of the strain threshold tensor. In an alternative embodiment, the strain tensor may be considered greater than the strain threshold when a function of one or more elements of the strain tensor in the corresponding region are greater than a corresponding function of the corresponding elements of the strain threshold.

The applicants have found systems and methods that improve what was previously the conflicting process goals of: a) high fluid filling speed and b) low overlay error. The applicants have found that it is possible to balance the relative distortion of substrate 102 and the template 108. The applicant has found that it is possible to balance localized distortions by adjusting the back pressure applied to the substrate during certain critical periods of the imprinting process. The amount that the back pressure is adjusted may be based on both the stiffness properties and local topography of both the substrate 102 and the template 108. The substrate stiffness properties include the Young's modulus of the substrate 102 and thickness of the substrate 102. The template stiffness properties include Young's modulus of the template 108 and the template thickness $d_t$.

Figure 4C:
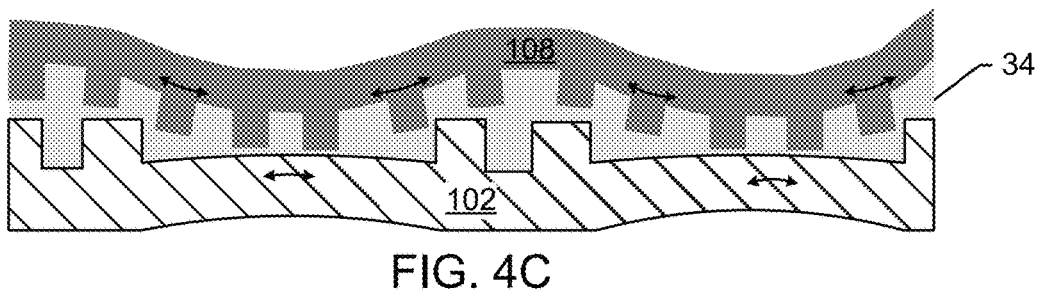

FIG. 4B is an illustration of substrate and template in which the substrate holding vacuum pressure is not balanced. In this case, most of the local distortion occurs on the template 108 only. By lowering the substrate vacuum back pressure as illustrated in FIG. 4C, the magnitude of the deflection of the template can be reduced while the substrate side is deformed. The back pressure control of the substrate can be performed either during the fluid spreading or after the fluid spreading. In an embodiment, the substrate is a Silicon wafer that is 0.785 mm thick, while the template is Silicon Oxide which is 1.1 mm thick, the vacuum back pressure that the substrate chuck may apply may be adjusted to a value of −1 kPa (kilopascal) to −15 kPa. The initial vacuum back pressure may be −20 kPa.

The vacuum back pressure may be adjusted based on overlay data measurements. Different portions of the substrate may be under different vacuum pressures when a zone-type substrate chuck is used. The adjusted substrate back pressure may be determined by a processor on the imprinting system or on a processor separate from the imprinting system. A processor may receive information that represents the overlay data measurements obtained from two or more previous imprinting steps. Two or more different adjusted back pressures may be used during the imprinting steps. The processor can determine an adjusted substrate back pressure in which a predicted overlay data measurement is within a specified tolerance. The predicted overlay data measurement may be determined from the overlay data measurements made with previous back pressures.

Figure 5A:
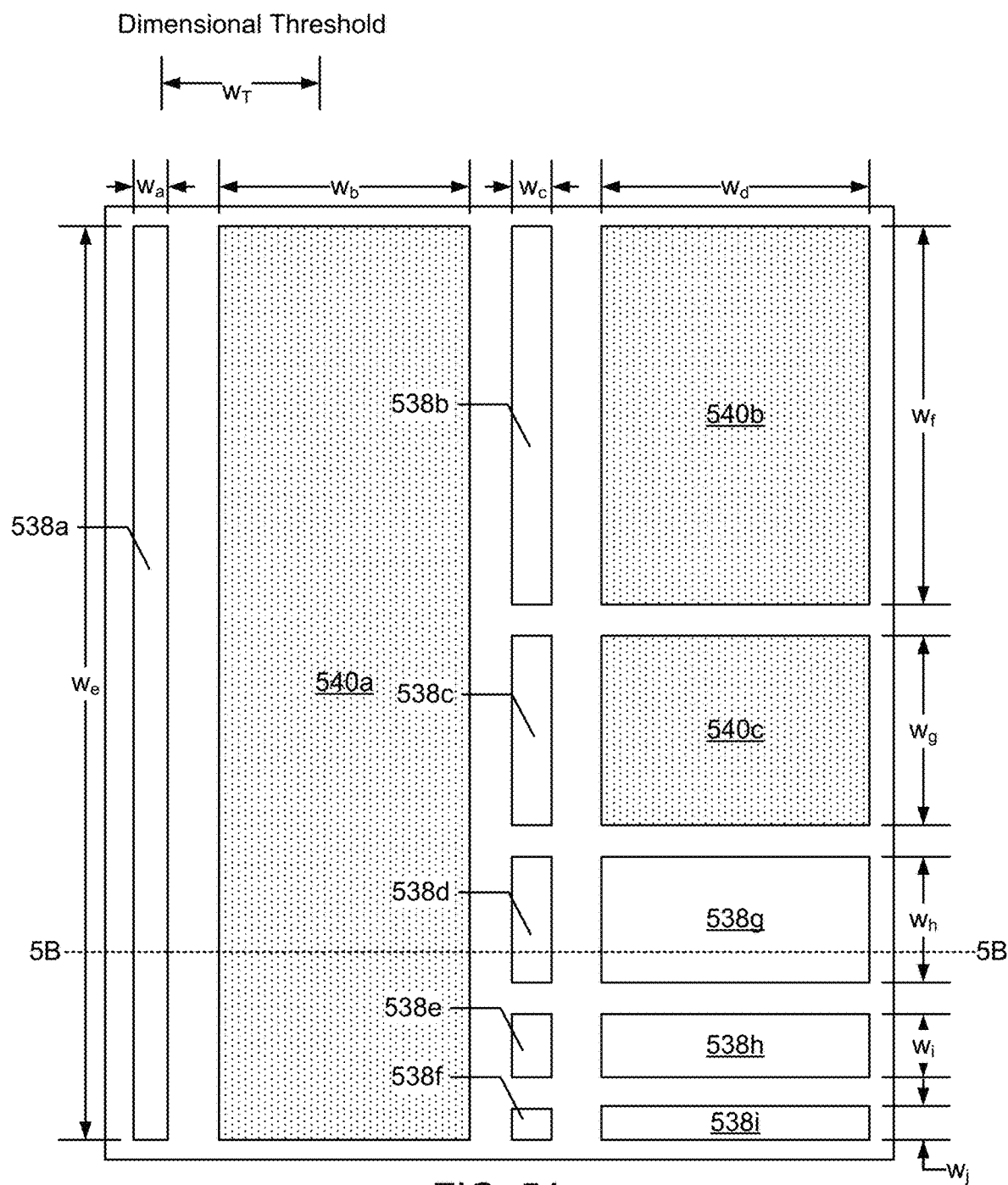
FIGS. 5A-5B are illustrations of an exemplary topography on a substrate surface that would be used in an embodiment.
Figure 5B:
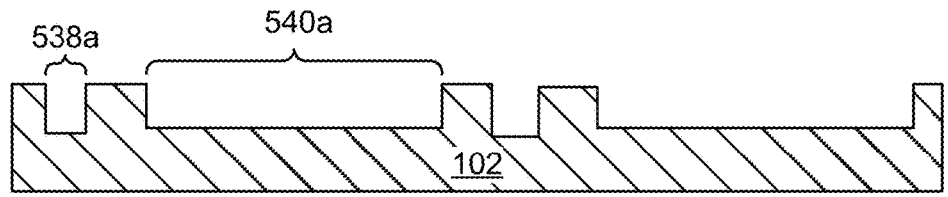

FIG. 5A is a top-down illustration of a portion of a substrate 102 with a plurality of features on the substrate surface 130 including a small features 538a-i, and large features 540a-c. FIG. 5B is a cross section (not to scale) along line 5B. The small feature 538a has a first width ($w_a$) in a first direction and a second width ($w_e$) in a second direction orthogonal to the first direction with dimensions ($w_a \times w_e$). The relevant dimension of the feature 538a is the narrowest dimension $w_a$ which is less than the dimensional tolerance $w_T$ ($w_a < w_T$) thus the feature 538a is a small feature and not a large feature. The relevant dimensions of the feature 538b, 538c, 538d, 538e, and 538f, is the narrowest dimension $w_c$ which is less than the dimensional tolerance $w_T$ ($w_c < w_T$) thus the features 538b-f are small features and are not large features. The relevant dimension of the feature 538g is the narrowest dimension $w_h$ which is less than the dimensional tolerance $w_T$ ($w_h < w_T$) thus the feature 538g is a small feature and not a large feature. The relevant dimension of the feature 538h is the narrowest dimension $w_i$ which is less than the dimensional tolerance $w_T$ ($w_i < w_T$) thus the feature 538h is a small feature and not a large feature. The relevant dimension of the feature 538i is the narrowest dimension $w_j$ which is less than the dimensional tolerance $w_T$ ($w_j < w_T$) thus the feature 538i is a small feature and not a large feature. The large feature 540a has dimensions $w_a \times w_e$. The relevant dimension of the feature 540a is the narrowest dimension $w_b$ which is greater than the dimensional tolerance $w_T$ ($w_b<w_T$) thus the feature 540a is a large feature. The relevant dimension of the feature 540b is the narrowest dimension $w_d$ which is greater than the dimensional tolerance $w_T$ ($w_b<w_T$) thus the feature 540b is a large feature. The relevant dimension of the feature 540c is the narrowest dimension $w_g$ which is greater than the dimensional tolerance $w_T$ ($w_g<w_T$) thus the feature 540c is a large feature. A feature may be specified as a large feature when the dimensions are greater than a dimensional threshold. Wherein the dimensional threshold is a function of the template thickness $d_t$ ($w_T=f(d_t)$). Two orthogonal parameters ($w_1$ and $w_2$) may be used describe the planar dimensions of a feature. A large feature is defined as a feature in which the minimum of the two orthogonal parameters is greater than the dimensional threshold ($\min(w_1, w_2)>w_T$).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of imprinting a formable material on a substrate with a template, the substrate including a large substrate feature and a dense substrate feature region, wherein a narrowest dimension of the large substrate feature in a plane of the substrate is greater than a dimensional threshold, the method comprising:
    holding the substrate by a substrate chuck with a first vacuum back pressure;
    positioning the template and the substrate relative to each other such that the template is in contact with the formable material on the substrate;
    a first region of the template is in contact with the formable material in the substrate feature;
    wherein a first template deformation above the large substrate feature is greater than second template deformation above the dense substrate feature region while the substrate is held by the substrate chuck with the first vacuum;
    holding the substrate by the substrate chuck with a second vacuum back pressure after holding the substrate with the first vacuum back pressure;
    the second vacuum back pressure is less than the first vacuum back pressure, wherein the second vacuum back pressure is not zero;
    while the substrate remains subjected to the second vacuum back pressure a third template deformation above the large substrate feature is less than the first template deformation; and
    starting to solidify the formable material, while the substrate remains subjected to the second vacuum back pressure.

2. The imprinting method according to claim 1, the dimensions of the large substrate feature are a first feature width in a first direction that is greater than 1 mm and a second feature width in a second direction orthogonal to the first direction that is greater than 1 mm.

3. The imprinting method according to claim 1, further comprising:
    dispensing the formable material as a plurality of droplets onto the substrate.

4. The imprinting method according to claim 3 further comprising:
    a fluid spreading period starts after the substrate begins to be held with the first vacuum back pressure, after which the plurality of droplets start to merge and spread out;
    the fluid spreading period ends when all of the plurality of droplets have merged and forms a film that covers an imprinting region of the template.

5. The imprinting method according to claim 4, the substrate begins to be held with the second vacuum back pressure during the fluid spreading period.

6. The imprinting method according to claim 4, the substrate begins to be held with the second vacuum back pressure after the fluid spreading period.

7. The imprinting method according to claim 1, the template has a pattern.

8. The imprinting method according to claim 1, the second vacuum back pressure continues to be applied after beginning of the starting to solidify the formable material.

9. The imprinting method according to claim 1, wherein the substrate chuck is a zone based vacuum chuck.

10. The imprinting method according to claim 1 further comprising:
    receiving substrate information, the substrate information including information that is representative of a size and a location of the large substrate feature; and
    determining the second vacuum back pressure based on the substrate information.

11. The imprinting method according to claim 1, further comprising:
    receiving overlay data measurements based on previous imprinting steps, the previous imprinting steps used a variety of second vacuum back pressures; and
    setting the second vacuum back pressure based on the variety second vacuum back pressures so as to minimize a predicted overlay data measurement based on the received overlay data measurements.

12. The imprinting method according to claim 1, in a first case in which the template has template features above the large substrate feature has a lower second vacuum back pressure than a second case in which the template does not have template features above the substrate feature.

13. The imprinting method according to claim 1, while the substrate remains subjected to the first vacuum back pressure, a template strain tensor of the template above the large substrate feature is greater than a strain threshold.

14. The imprinting method according to claim 13, an absolute value of a difference between a template strain above the large substrate feature and a substrate strain below the large substrate feature is below a strain difference threshold beginning at a strain matched time that begins after the substrate begins to be held with the second vacuum back pressure and the strain matched time begins prior to beginning of the starting to solidify the formable material.

15. The imprinting method according to claim 13 further comprising:
    the large substrate feature has a first feature width in a first direction that is greater than a first dimensional threshold and a second feature width in a second direction orthogonal to the first direction that is greater than the first dimensional threshold;
    the substrate further includes a second substrate feature in dense substrate feature region, the second substrate feature has a second feature width that is less than the first dimensional threshold; and a second template strain that the template experiences in a second region of the template that is in contact with the formable material in the second substrate feature is below a strain threshold.

16. The imprinting method according to claim 13, further comprising:
    separating the template from the formable material that has solidified on the substrate after the starting to solidify the formable material; and
    start holding the substrate with a third vacuum back pressure greater than the second vacuum back pressure after the starting to solidify the formable material and prior to a starting of the separation of the template from the formable material;
    a difference between the template strain tensor and a substrate strain tensor after the starting of the separation of the template from the formable material is reduced by adjusting the third vacuum back pressure to be greater than the second vacuum back pressure.

17. The imprinting method according to claim 13, the template strain tensor above the large substrate feature is greater than the strain threshold during a subset of time while the substrate is held with the first vacuum back pressure.

18. A method of manufacturing an article imprinting a formable material on a substrate with a template, the substrate including a large substrate feature and a dense substrate feature region, wherein a narrowest dimension of the large substrate feature in a plane of the substrate is greater than a dimensional threshold, the method comprising:

holding the substrate by a substrate chuck with a first vacuum back pressure;

positioning the template and the substrate relative to each other such that the template is in contact with the formable material on the substrate, while the substrate is held with the first vacuum back pressure;

a first region of the template is in contact with the formable material in the substrate feature;

wherein a first template deformation above the large substrate feature is greater than second template deformation above the dense substrate feature region while the substrate is held by the substrate chuck with the first vacuum;

holding the substrate by the substrate chuck with a second vacuum back pressure after holding the substrate with the first vacuum back pressure;

the second vacuum back pressure is less than the first vacuum back pressure, wherein the second vacuum back pressure is not zero;

while the substrate remains subjected to the second vacuum back pressure a third template deformation above the large substrate feature is less than the first template deformation;

starting to solidify the formable material, while the substrate remains subjected to the second vacuum back pressure;

separating the template from the solidified formable material; and processing the substrate, to manufacture the article.

* * * * *